United States Patent [19]

Kravitz

[11] 3,821,616

[45] June 28, 1974

[54] MONOLITHIC SEMICONDUCTOR DISPLAY DEVICES

[75] Inventor: Lawrence C. Kravitz, Schenectady, N.Y.

[73] Assignee: General Electric Co., Schenectady, N.Y.

[22] Filed: Oct. 16, 1972

[21] Appl. No.: 297,809

[52] U.S. Cl...........357/29, 313/108 D, 315/169 TV
[51] Int. Cl......................... H01l 15/00, H05b 33/16
[58] Field of Search........ 317/235 N, 235 R, 234 Q, 317/235 NA; 313/108 D; 315/169 TV

[56] References Cited

UNITED STATES PATENTS

| | | | |
|---|---|---|---|
| 3,112,230 | 11/1963 | Rudenberg | 136/89 |
| 3,293,513 | 12/1966 | Biard et al. | 317/237 |
| 3,349,475 | 10/1967 | Marinace | 29/578 |
| 3,473,032 | 10/1969 | Lehovec | 250/211 |
| 3,501,676 | 3/1970 | Adler et al. | 315/169 |
| 3,558,974 | 1/1971 | Stewart | 315/169 |
| 3,573,530 | 4/1971 | Kohashi | 313/108 |
| 3,573,568 | 4/1971 | Siegel | 317/234 |
| 3,617,929 | 11/1971 | Richardson et al. | 331/94.5 |
| 3,703,656 | 11/1972 | Barnett et al. | 313/108 D |
| 3,703,670 | 11/1972 | Kunz | 317/235 |
| 3,717,800 | 2/1973 | Thillays et al. | 317/234 |

OTHER PUBLICATIONS

J. Blum et al., "Solid-State Light-Emitting Diodes," I.B.M. Tech. Discl. Bull., Vol. 13 No. 9, Feb. 1971, p. 2494.

J. Blum et al., "LPE of Led Arrays With Grown Junctions," I.B.M. Tech. Discl. Bull., Vol. 14, No. 6, Nov. 1971, p. 1873.

J. Marinace et al., "Narrow Junction Lasers," I.B.M. Tech. Discl. Bull., Vol. 15 No. 2, July 1972, pp. 562–563.

*Primary Examiner*—Rudolph V. Rolinec
*Assistant Examiner*—Joseph E. Clawson, Jr.
*Attorney, Agent, or Firm*—Julius J. Zaskalicky; Joseph T. Cohen; Jerome C. Squillaro

[57] ABSTRACT

A substrate wafer of semi-insulating semiconductor material is provided with a first plurality of substantially parallel stripes of one conductivity type in one of the opposed faces thereof, each of the stripes extending from the face inward a first distance. A second plurality of substantially parallel stripes of opposite conductivity type is provided extending inward from the same face a second distance greater than the first distance. The first and second plurality of stripes form a plurality of light emitting diodes. A first plurality of high conductivity films in contact with the first plurality of stripes and a second plurality of high conductivity films in contact with the secondary plurality of stripes provide electrical connection to the array of diodes from the same side of the substrate. Such a structure provides a pair of P-N junctions in the diodes of a small cross-sectional area which are operable at higher current densities to achieve high efficiency of conversion of electrical input to radiative output. By the choice and disposition of metallization of the stripes of one and the opposite conductivity type high optical extraction efficiency and excellent optical isolation between adjacent diodes is obtained.

12 Claims, 10 Drawing Figures

MONOLITHIC SEMICONDUCTOR DISPLAY DEVICES

The present invention relates to display devices and more particularly to monolithic semiconductor display devices and methods for making the same.

This application is related to our copending applications Ser. Nos. 116,005 and 116,125 both filed Feb. 17, 1971 and of common assignee as the present application.

An object of this invention is to provide an improved monolithic array of light emitting diodes.

Another object of this invention is to provide a monolithic array of light emitting diodes which are electrically and optically isolated from one another.

Another object of this invention is to provide a monolithic matrix addressable display device on an optically transparent substrate in which electrical connections to the diodes of the array are made to one face of the substrate.

Another object of the present invention is to provide light emitting diodes which have P-N junctions small in cross-section, hence operable at higher current densities for a given input current, and accordingly operable at higher overall conversion efficiency.

Another object of the present invention is to provide a light emitting P-N junction diode structure of high optical extractive efficiency.

In accordance with one illustrative embodiment of the invention, a substrate wafer of semi-insulating semiconductor material such as gallium phosphide having a pair of opposed surfaces is provided. A first plurality of substantially parallel stripes of N-type conductivity is formed in one of said opposed surfaces of the substrate, each of the stripes extending from the surface inward a first distance toward the other opposed surface. A second plurality of substantially parallel stripes of P-type conductivity is formed in the same surface of the wafer, each of the stripes also extending from the same surface inward a second distance toward the other opposed surface of the substrate, the second distance being greater than the first distance. The stripes of the N-type conductivity are orthogonal to the stripes of P-type conductivity to form a plurality of light emitting diodes. A first plurality of thin film conductive lines is provided, each in conductive contact with and substantially overlaying a major portion of a respective one of the N-type conductivity stripes. A second plurality of conductive thin film lines is provided, each in conductive contact with and substantially covering a major portion of a respective one of the P-type conductivity stripes.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

Figure 1:
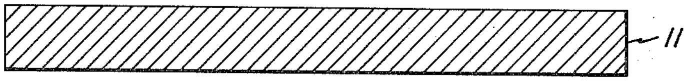
FIGS. 1–8 are schematic cross-section views of a substrate wafer illustrating steps in the fabrication of a monolithic array of diodes therefrom in accordance with the present invention.

Reference is now made to FIG. 1 which shows a substrate wafer 11 such as a wafer of semi-insulating gallium phosphide, having a thickness of 10 mils, for example. Semi-insulating gallium phosphide has a resistivity of the order of $10^6$ ohm-cms. The wafer may be cut from a single crystal inot. The wafer is oriented with its major opposed surfaces along the [111] crystallographic plane which provides an exceptionally good surface for liquid phase epitaxial growth to be used in the fabrication of the array.

Figure 2:
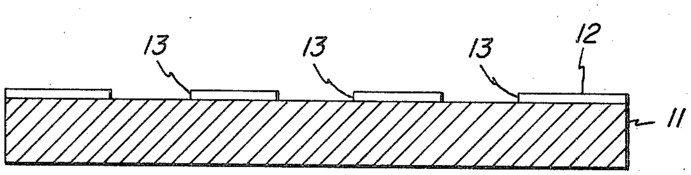

The substrate is provided with a masking layer of a material such as silicon dioxide, silicon nitride, or other useful masking layers which inhibit growth on the surfaces thereof. For purposes of illustration, a silicon dioxide layer 12 having a thickness of approximately 3,000 Angstroms is formed over the surface of the semi-insulating substrate 11 by pyrolytic deposition. A plurality of substantially parallel grooves 13 are then etched through the masking layer by a photolithographic masking and etching technique well known to those skilled in the art to expose the surface of the substrate wafer in the etched portions of the mask layer as shown in FIG. 2. Conveniently, the parallel grooves are approximately 10 mils wide on 20 mil centers for this embodiment of the invention.

Figure 3:
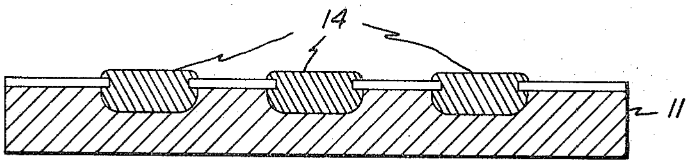

N-type conductivity stripes of gallium phosphide are next formed in the surface exposed portions of the wafer 11 by a selective liquid epitaxy process such as described in the aforementioned copending patent application Ser. No. 116,125. The aforementioned application to which reference may be made describes a process including the preparation of a molten solution of a non-conductivity modifying solvent, the required amount and type of semiconductor material and suitable conductivity-modifying impurities to produce, at a first temperature, a saturated solution with excess semiconductor material. Epitaxial growth is begun by immersing the wafer 11 into the saturated solution and then abruptly increasing the solution temperature a few degrees to dissolve the unmasked portions of the substrate and then lowering the temperature of the solution at a programmed rate until the desired epitaxial growth thickness is achieved. In accordance with this process, for example, the surface portion of the semi-insulating substrate is first dissolved to a depth approximately 2 mils and then the N-type stripes 14 are grown therein as shown in FIG. 3. The result of the epitaxial growth is to provide a plurality of N-type stripes at least partially embedded in one side of the semi-insulating substrate wafer 11.

Figure 4:
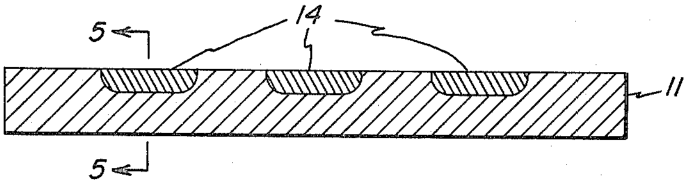
Figure 5:
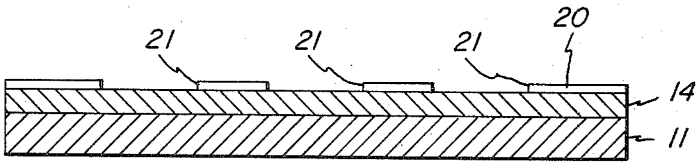

After forming the N-type stripes as described above, the surface of the substrate is lapped and polished so that the exposed surface of the N-type stripes are substantially parallel or planar with the surface of the semi-insulating substrate wafer, as illustrated in FIG. 4. The substrate wafer 11 is then again masked with suitable masking material 20, such as a layer of silicon dioxide 3,000 Angstroms thick, and a second pattern of grooves 21 substantially perpendicularly oriented with respect to the N-type stripes 14 is etched therein using the same photolithographic masking and etching technique mentioned above. The grooves 21 may also be 10 mils wide on 20 mil centers. FIG. 5 is a cross-sectional view of the wafer 11 taken along the line 5—5 of FIG. 4 illustrating a single N-type stripe 14 with a patterned masking layer 20 thereon having a plurality of etched grooves 21.

Figure 6:
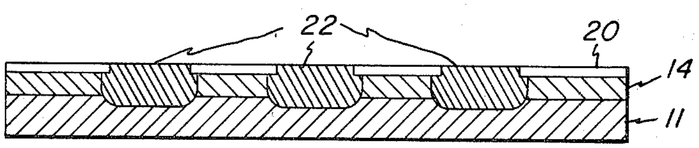

The wafer 11 is next subjected to a P-type liquid phase epitaxy growth process wherein P-type material such as gallium phosphide doped with zinc, for example, is grown in the grooves 21 of the surface exposed portions of the substrate wafer 11 with the growth extending into the wafer a greater distance than the growth of N-type stripes, for example 3 mils. The resultant structure is shown in FIG. 6. A process similar to that described above, for example, is advantageously used to grow the P-type stripes. As the P-type stripes extend beyond the extent of the N-type stripes into the semi-insulating portion of the wafer underlying the N-type stripes at the intersection of each of the P-type stripes with the N-type stripes, a diode is formed including a pair of P-N junctions.

Figure 7:
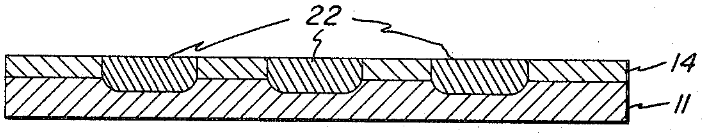

The P-type stripes are then lapped and polished so that the exposed surface of the P-type stripes and also the N-type stripes are substantially parallel or planar with the surface of the wafer as illustrated in FIG. 7. Conductive thin film lines or ribbons 25 of gold are deposited on the surface of the P-type stripes 22 utilizing photolithographic masking and etching techniques well known to those skilled in the art. The ribbons 25 are subsequently alloyed into the semiconductor material and reacts with the gallium phosphide substrate to form good absorbers of visible radiation incident on the interfaces thereof. Thereafter a layer of an insulating material such as silicon dioxide 26 or other glass is pyrolytically deposited on the surface of the wafer including the conductive gold ribbons as shown in FIG. 8.

Figure 8:
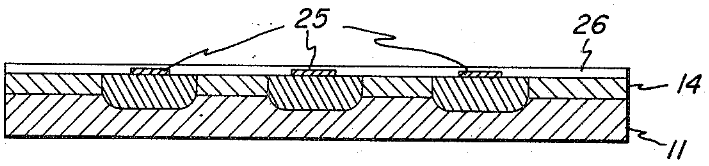
Figure 9:
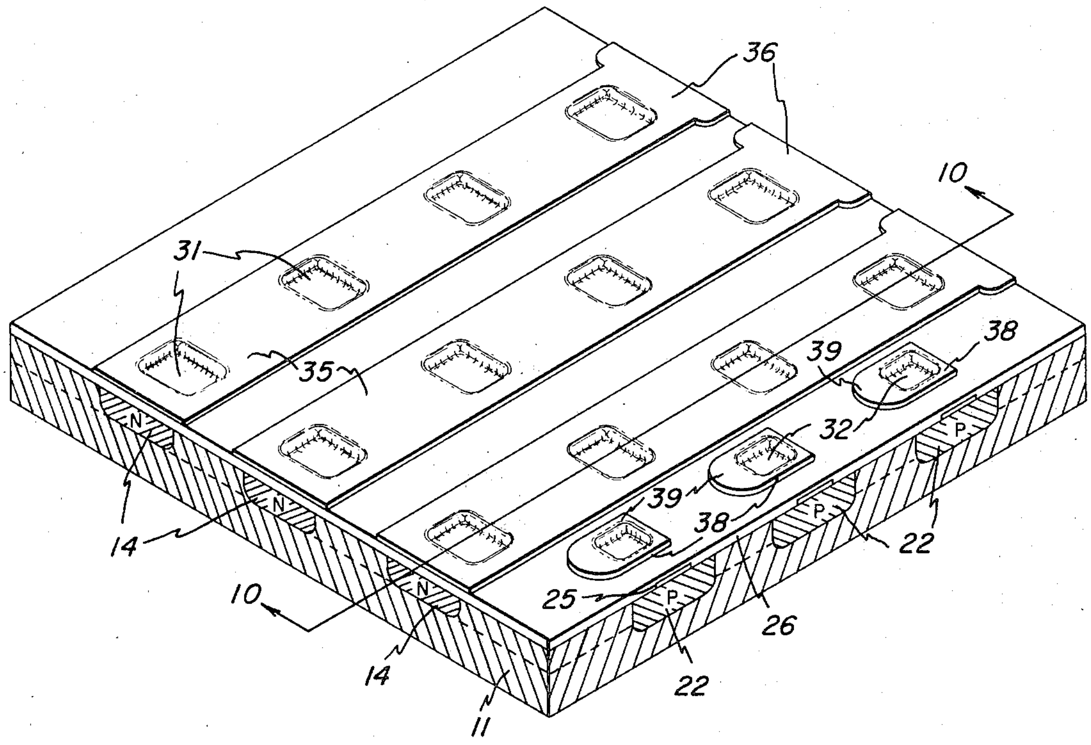
FIG. 9 is a perspective view of a monolithic array of light emitting diodes in accordance with the present invention.

Referring now to FIG. 9, there is shown the substrate wafer 11 of FIG. 8 with silicon dioxide layer 26 thereon on which additional etching and metallization operations are performed to provide a completed monolithic semiconductor array of light emitting diodes. A first plurality of twelve rectangular windows 31 is etched in the oxide layer 26 to expose the upper or back face of wafer 11. The windows are arranged in three rows with each row including four windows. The windows of each row expose portions of a respective N-type conductivity stripe 14. Gold-germanium alloy and nickel are then evaporated over the surface and alloyed into the wafer through the windows 31. Unalloyed metal is cleaned from the $SiO_2$ and a second evaporated metallic layer of gold or aluminum is evaporated and patterned to form the three conductive thin film lines 35 each including a respective contact or terminal pad 36. A second plurality of rectangular windows 32 is then etched to expose the three conductive thin film 25 connected to respective P-type conductivity stripes 25. A metallic layer of gold or aluminum is evaporated and patterned to form the three conductive tabs 38, each contacting a respective P-type stripe 25 through associated elongated conductive thin film member 25 connected thereto. Each tab 38 includes a respective contact pad 39.

Figure 10:
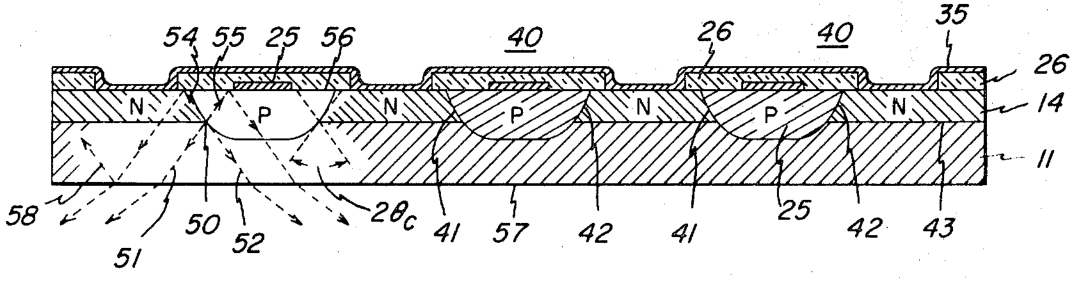
FIG. 10 is a cross-sectional view of the array of FIG. 9 taken along section 10—10 thereof useful in showing the internal structure of the array and explaining the operation thereof.

The completed monolithic array includes nine diodes each including a pair of P-N junctions 41 and 42 clearly depicted in FIG. 10. Each of the P-N junctions extends from a rear face or surface of the wafer downward to the interface 43 of the N-type stripe with the underlying semi-insulating portion of the substrate wafer 11. Each of the P-N junctions has a lateral width equal to the width of the N-type stripe. The gold underface of the conductive film members 35 forms with the oxide layer 26 overlaying each of the P-N junctions a surface highly reflective to light. Accordingly, in accordance with one feature of the invention, light generated in the P-N junctions and transmitted to the rear face of the wafer is reflected and passes on out through the front face of the wafer along with light transmitted directly from the P-N junctions out the front face of the wafer. Accordingly, to provide a maximum reflection of light, the conductive film members 35 should preferably have a width at least as great as the width of the N-type stripes. The gold undersurface of the conductive members 35 alloyed into the N-type stripes 14 produce an interface which is highly absorptive of visible radiation. Similarly, the gold undersurface of the elongated conductive film members 25 alloyed into the P-type stripes 22 is highly absorptive of visible radiation. Accordingly, the portions of the conductive film members 35 which contact the N-type stripes and the width of the elongated conductive film members 25 is set so that the light from the P-N junction which travels rearwardly is reflected from the gold-oxide surface and the light which exceeds critical angle of the semi-insulating seminconductor material is absorbed by portions of N-type stripes contacted by member 35 and by portions of the P-type stripes contacted by member 25. Such proportioning provides good isolation of the P-N junctions of a diode from the P-N junctions of an adjacent diode in that any light emitted from the P-N junction beyond the critical angle thereof is substantially absorbed. Of course the members 25 are made sufficiently wide and centrally located on the P-type stripes 25 to achieve this result. Similarly, the members 35 are made sufficiently wide and centrally disposed between adjacent P-type stripes to also achieve this result.

In the diodes of FIGS. 9 and 10, the total P-N junction area of the pair of P-N junctions is substantially less than the area of the P-N junction which would be formed were the P-type stripes to extend a distance into the substrate less than the distance to which the N-type stripes extend. Accordingly, for a given current flow through the diodes, a higher current density is achieved in the P-N junctions and, accordingly, higher conversion efficiency can be realized when the efficiency increases with current density such as in green emitting gallium phosphide diodes. A particular advantage of the array is the organization in which electrical connections to the diodes of the array are all made from the rear face of the array thereby simplifying the application of energization thereto.

Reference is now made particularly to FIG. 10. Along a line perpendicular to the opposed faces of the semi-insulating wafer 11, the dimensions of the various elements of the array are greatly exaggerated in order to clearly illustrate the structure thereof. For example, the depth of penetration of the N-type stripe may be of the order of 2 mils. The depth of penetration of the P-type stripe may be of the order of 3 mils. The semi-insulating wafer may be 10 mils thick. The silicon dioxide insulating layer may be of the order of 0.3 of a micron which would be about 1/75th of a mil. Accordingly, for all practical purposes, the reflecting surface of the silicon dioxide gold interface is coincident with the back surface of the wafer. Light striking the back surface wafer is reflected forward and passes out of the front face of the wafer. FIG. 10 shows two light rays 51 and 52 from the forward edge 50 of a P-N junction 41 radiating outward to the front face of the wafer where they are refracted in passing to the surrounding mediuum. Two rays 54 and 53 are also shown eminating from the forward edge of the P-N junction 41. Ray 54 is shown impinging on the reflective surface 56 at the interface adjacent an edge of the conductive thin film line 25 and being reflected to the front face 57 of the wafer 11 and outward. The edge of the conductive thin film line 25 is set so that it is located beyond a line where light from the forward edge of the P-N junction 41 impinges on it at the critical angle $\theta_c$. Accordingly, light from the forward edge 50 of the P-N junction transmitted at an angle greater than the critical angle $\theta_c$ impinges on the absorptive interface of the gold film 25 and the P-type stripe and is absorbed. Similarly, the edge of the conductive thin film line 35 on the opposite side of the P-N junction 41 is set so that light traveling from the fowardly located edge 50 of the P-N junction which impinges at less than the critical angle, represented by ray 54, is reflected back to the front face of the wafer and outward. Light which impinges on the rear face of the wafer at an angle greater than the critical angle is absorbed by the absorptive interface between line 35 and wafer 11. Light impinging on the front face of the wafer 11 which is partially reflected inward is also absorbed by the absorptive interface between the line 35 and the rear face of the wafer 11, as illustrated by ray 58. Accordingly, to provide maximum efficiency of extraction of light from the array, the spacing between the edge of a line 25 and a line 35 adjacent a P-N junction is set so that the angle subtended thereby at the forward edge 50 of the P-N junction is equal to substantially twice the critical angle $\theta_c$ of the semi-insulating semiconductor material.

While the invention has been illustrated in connection with gallium phosphide semiconductor material, it is apparent that other semiconductor materials such as the group III-V semiconductor compounds including gallium arsenide phosphide, gallium aluminum phosphide, gallium indium phosphide, gallium aluminum arsenide and others may be used.

While a transparent semi-insulating substrate is utilized in the fabrication of the array, a slightly light absorbing substrate is desirable. Such a substrate preferentially absorbs multiple surface reflected light and thus provides better contrast. An absorption coefficient which provides about ten percent attenuation of light which passes from one major face of the substrate wafer to the opposite major face along the shortest distance therebetween results in distinctly improved contrast. Such absorption may be obtained in the initially prepared substrate wafer by suitable doping.

In accordance with the present invention, applicant has provided a light emitting diode array of high electrical to light conversion efficiency, high light extractive efficiency, good isolation between the elements of the array and also has provided a simple organization of conductive connections to the array from a single face thereof opposite the face to be viewed or from which light is extracted.

While the invention has been described in a specific embodiment, it will be appreciated that modifications, such as those described above, may be made by those skilled in the art and it is intended by the appended claims to cover all such modifications and changes as fall within the true spirit and scope of the invention.

What I claim as new and desire to secure by Letters Patent of the United States is:

1. A display device comprising a substrate of semi-insulating semiconductor material having a pair of opposed surfaces, a first plurality of substantially parallel stripes of one conductivity type formed in one of said opposed surfaces of said substrate, each of said stripes extending from said one surface inward a first distance toward the other of said opposed surfaces, a second plurality of substantially parallel stripes of opposite conductivity type formed in said one surface, each of said stripes extending from said one surface inward a second distance toward the other of said opposed surfaces, said second distance being greater than said first distance, each stripe of said opposite conductivity type intersecting all of the stripes of said one conductivity type to form a plurality of light emitting diodes therewith, each light emitting diode including a pair of P-N junctions extending generally orthogonally to said one surface, a first plurality of conductive lines each in conductive contact with a respective one of said one conductivity type stripes in said one surface, a second plurality of conductive lines each in conductive contact with a respective one of said other conductivity type stripes in said one surface.

2. The combination of claim 1 in which each of the conductive lines of said first plurality is a thin metallic film in conductive contact with and substantially covering a major portion of a respective one of said one conductivity type stripes in said one surface and in which each of the conductive lines of said second plurality is a thin metallic film in conductive contact with and substantially covering a major portion of a respective one of said other conductivity type stripes in said one surface.

3. The combination of claim 1, in which said semiconductor material is selected from the class of Group III-V compounds including gallium arsenide phosphide, gallium aluminum phosphide, gallium indium phosphide, and gallium aluminum arsenide.

4. The combination of claim 1 in which said semiconductor material is gallium phosphide.

5. The combination of claim 1 in which said semiconductor material slightly absorbs light passing therethrough.

6. The combination of claim 1 in which said substrate of semiconductor material is semi-insulating gallium phosphide and in which said one type conductivity stripes are constituted of N-type gallium phosphide material and said other type conductivity stripes are constituted of P-type gallium phosphide material.

7. The combination of claim 2 in which the stripes of said first plurality are linear and parallel and in which the stripes of said second plurality are linear and orthogonally oriented with respect to the stripes of said first plurality.

8. The combination of claim 2 in which said conductive thin film lines are alloyed into said semiconductor material.

9. The combination of claim 2 in which each of said first plurality of conductive thin film lines includes a plurality of portions each spaced from the stripes of opposite conductivity type material, the face of said spaced portions of said first plurality of conductive thin film lines adjacent said one surface being reflective to visible radiation, the portions of each of said first plurality of conductive thin film lines in contact with said one surface being absorptive of visible radiation.

10. The combination of claim 9 in which spacing of an edge of each said second plurality of conductive thin film lines with respect to an adjacent edge of said first plurality of conductive thin film lines is set to permit substantially all of the radiation from the P-N junction included therebetween impinging on said one surface at an angle less than the critical angle to pass through said surface to said film where it is reflected and passes out the other surface of said substrate, said conductive thin film lines in contact with said one surface absorbing a substantial portion of the radiation impinging thereon.

11. The combination of claim 10 in which a layer of a transparent insulating material is included between the stripes of said second plurality and the portions of said first plurality of conductive thin film lines overlying the stripes of said second plurality of stripes.

12. The combination of claim 11 in which the surface portion of said conductive thin film lines adjacent said insulating material is a layer of gold and said insulating material is silicon dioxide.

* * * * *